(12) United States Patent
Liu et al.

(10) Patent No.: US 6,924,191 B2
(45) Date of Patent: Aug. 2, 2005

(54) METHOD FOR FABRICATING A GATE STRUCTURE OF A FIELD EFFECT TRANSISTOR

(75) Inventors: Wei Liu, San Jose, CA (US); Thorsten B. Lill, Santa Clara, CA (US); David S. L. Mui, Fremont, CA (US); Christopher Dennis Bencher, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 48 days.

(21) Appl. No.: 10/463,460

(22) Filed: Jun. 16, 2003

(65) Prior Publication Data

US 2004/0043623 A1 Mar. 4, 2004

Related U.S. Application Data

(60) Provisional application No. 60/390,544, filed on Jun. 20, 2002, and provisional application No. 60/398,042, filed on Jul. 22, 2002.

(51) Int. Cl.$^7$ .......................................... H01L 21/8242
(52) U.S. Cl. ................. 438/241; 438/328; 438/275; 438/595; 438/182; 438/270; 438/257; 438/694
(58) Field of Search .......................... 438/241, 328, 438/275, 595, 182, 270, 257, 694

(56) References Cited

U.S. PATENT DOCUMENTS

| | | | | |
|---|---|---|---|---|
| 5,824,578 A | * | 10/1998 | Yang | 438/231 |
| 5,942,787 A | | 8/1999 | Gardner et al. | 257/408 |
| 5,981,398 A | | 11/1999 | Tsai et al. | 438/710 |
| 6,013,570 A | * | 1/2000 | Yu et al. | 438/595 |
| 6,022,815 A | | 2/2000 | Doyle et al. | 438/947 |
| 6,051,486 A | | 4/2000 | Gardner | 438/585 |
| 6,110,837 A | | 8/2000 | Linliu et al. | 438/723 |
| 6,162,696 A | | 12/2000 | Cheng et al. | 438/312 |
| 6,197,644 B1 | | 3/2001 | Gardner et al. | 438/279 |
| 6,207,490 B1 | * | 3/2001 | Lee | 438/241 |
| 6,346,449 B1 | | 2/2002 | Chang et al. | 438/305 |
| 6,362,061 B1 | | 3/2002 | Krivokapic et al. | 438/303 |
| 6,406,951 B1 | | 6/2002 | Yu | 438/183 |
| 6,566,208 B2 | | 5/2003 | Pan et al. | 438/300 |
| 2002/0009859 A1 | | 1/2002 | Oh | 438/311 |
| 2002/0142539 A1 | * | 10/2002 | Tu et al. | 438/239 |
| 2003/0032228 A1 | | 2/2003 | Honeycutt | 438/197 |

OTHER PUBLICATIONS

PCT International Search Report Dated Nov. 12, 2003, For International Application No. PCT/US 03/19250, International Filing Date Jun. 18, 2003, For Applicant Applied Materials, Inc.

* cited by examiner

Primary Examiner—Matthew Smith
Assistant Examiner—Victor V Yevsikov
(74) Attorney, Agent, or Firm—Moser, Patterson & Sheridan LLP.; Joseph Bach (57) ABSTRACT

A method for fabricating features on a substrate having reduced dimensions. The features are formed by defining a first mask on regions of the substrate. The first mask is defined using lithographic techniques. A second mask is then conformably formed on one or more sidewalls of the first mask. The features are formed on the substrate by removing the first mask and then etching the substrate using the second mask as an etch mask.

20 Claims, 12 Drawing Sheets

METHOD FOR FABRICATING A GATE STRUCTURE OF A FIELD EFFECT TRANSISTOR

CROSS-REFERENCE TO RELATED APPLICATIONS

This application claims benefit of U.S. provisional application Ser. No. 60/390,544, filed Jun. 20, 2002, and U.S. provisional application Ser. No. 60/398,042, filed Jul. 22, 2002, which are herein incorporated by reference.

BACKGROUND OF THE INVENTION

1. Field of the Invention

The present invention generally relates to a method for fabricating devices on semiconductor substrates. More specifically, the present invention relates to a method for fabricating a gate structure of a field effect transistor.

2. Description of the Background Art

Ultra-large-scale integrated (ULSI) circuits typically include more than one million transistors that are formed on a semiconductor substrate and cooperate to perform various functions within an electronic device. Such transistors may include complementary metal-oxide-semiconductor (CMOS) field effect transistors.

A CMOS transistor includes a gate structure that is disposed between a source region and a drain region defined in the semiconductor substrate. The gate structure generally comprises a gate electrode formed on a gate dielectric material. The gate electrode controls a flow of charge carriers, beneath the gate dielectric, in a channel region that is formed between the drain and source regions, so as to turn the transistor on or off. The channel, drain and source regions are collectively referred to in the art as a "transistor junction". There is a constant trend to reduce the dimensions of the transistor junction and, as such, decrease the gate electrode width in order to facilitate an increase in the operational speed of such transistors.

In a CMOS transistor fabrication process, a lithographically patterned mask is used during etch and deposition processes to form the gate electrode. However, as the dimensions of the transistor junction decrease (e.g., dimensions less than about 100 nm), it is difficult to accurately define the gate electrode width using conventional lithographic techniques.

Therefore, there is a need in the art for a method of fabricating a gate structure of a field effect transistor having reduced dimensions.

SUMMARY OF THE INVENTION

The present invention is a method for fabricating features on a substrate having reduced dimensions. The features are formed by defining a first mask on regions of the substrate. The first mask is defined using lithographic techniques. A second mask is then conformably formed on one or more sidewalls of the first mask. The features are formed on the substrate by removing the first mask and then etching the substrate using the second mask as an etch mask.

In one embodiment of the present invention a gate structure of a field effect transistor is fabricated. The gate structure comprises a gate electrode formed on a gate dielectric layer. The gate structure is fabricated by depositing a first mask layer on a gate electrode layer formed on a substrate over a plurality of regions wherein transistor junctions are to be defined. A first mask is lithographically defined in the first mask layer. A second mask is then conformably formed on one or more sidewalls of the first mask. The gate electrode is formed by removing the first mask and etching the gate electrode layer using the second mask as an etch mask.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method for fabricating features on a substrate having reduced dimensions. The features are formed by defining a first mask on regions of the substrate. The first mask is defined using lithographic techniques. A second mask is then conformably formed on one or more sidewalls of the first mask. The features are formed on the substrate by removing the first mask and then etching the substrate using the second mask as an etch mask.

The present invention is illustratively described with reference to a method for fabricating a gate structure of a field effect transistor on a substrate. The gate structure comprises a gate electrode formed on a gate dielectric layer. The gate structure is fabricated by depositing a gate electrode layer on a gate dielectric layer over a plurality of regions wherein transistor junctions are to be defined on the substrate. A first mask is lithographically formed on regions of the gate electrode layer between adjacent regions wherein the transistor junctions are to be formed. Second masks are then conformably formed on one or more sidewalls of the first mask, such that each second mask is positioned above a channel region of a transistor junction to be formed. The gate structure is completed by removing the first mask and then etching the gate electrode layer to the gate dielectric layer using the second mask as an etch mask.

The thickness of the second mask conformably formed on one or more sidewalls of the first mask is used to determine the width of the gate electrodes of the transistors. Such second mask width depends on a deposition process rather than on a lithography process advantageously providing gate widths less than 30 nm.

Figure 1A:
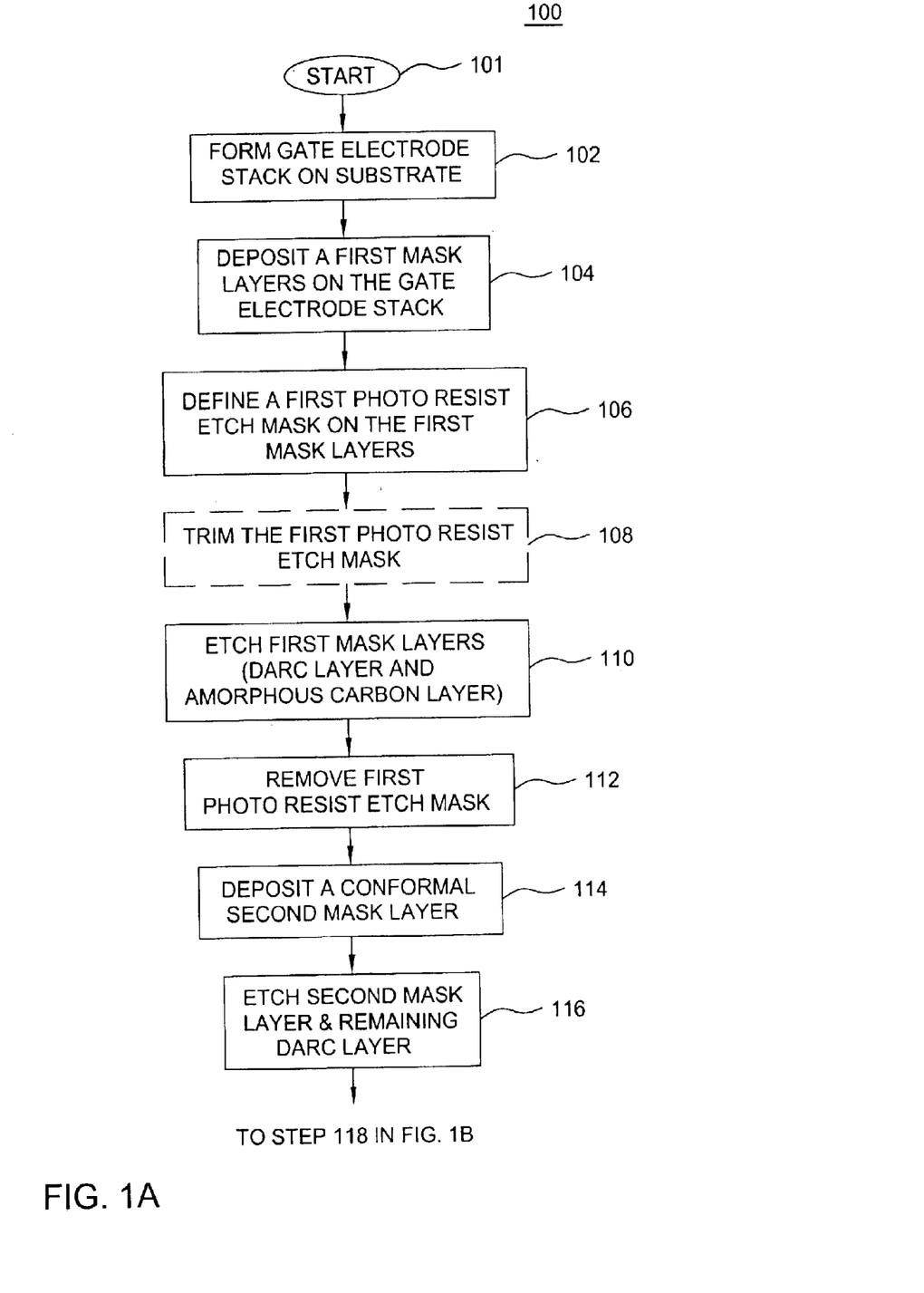
FIGS. 1A and 1B depict a flow diagram of a method of fabricating a gate structure of a field effect transistor in accordance with the present invention.
Figure 1B:
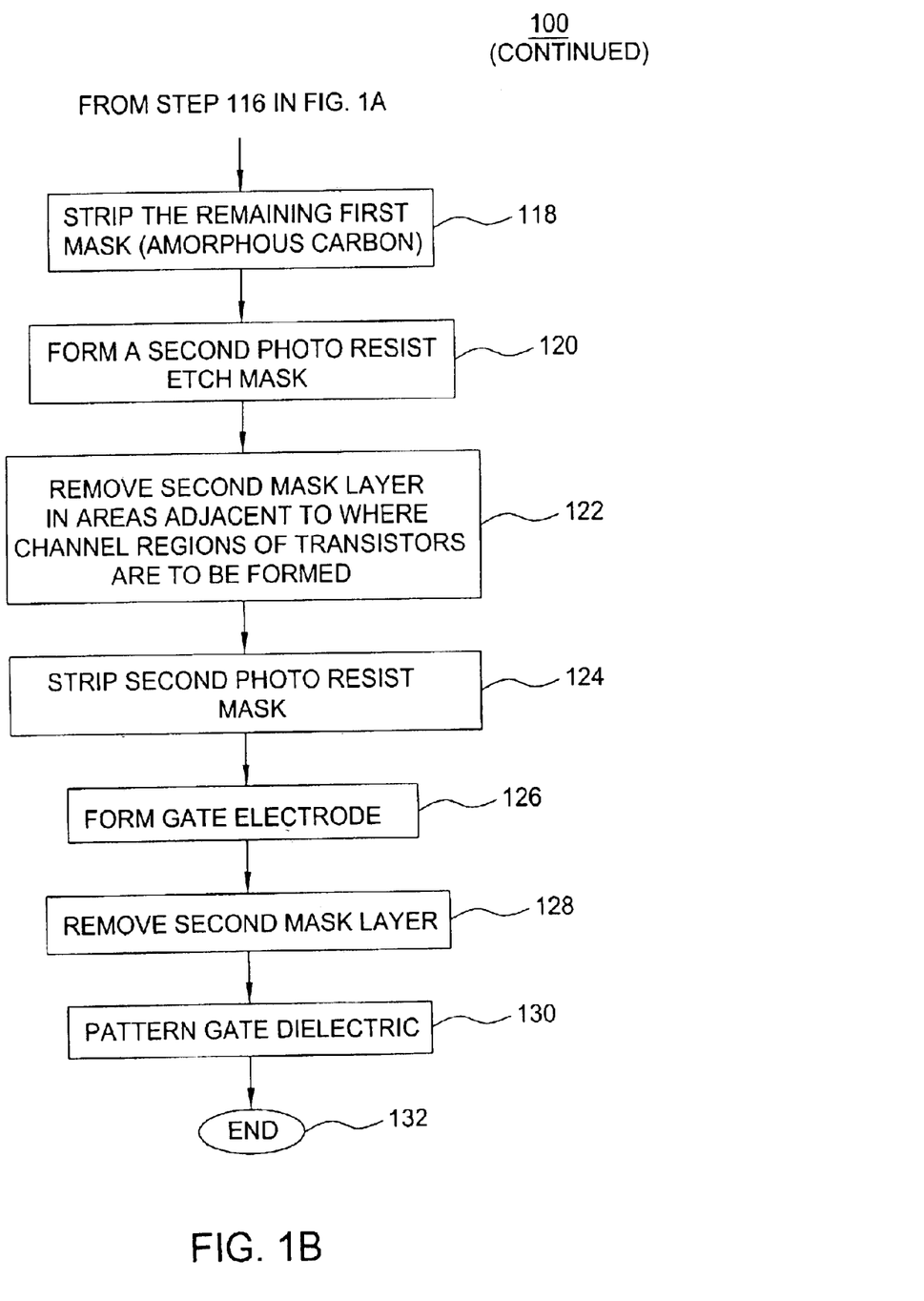

FIGS. 1A–1B together depict a flow diagram of a process sequence 100 for fabricating a gate electrode in accordance with the present invention. The sequence 100 comprises process steps that are performed upon a gate electrode film stack during fabrication of a field effect transistor (e.g., CMOS transistor).

Figure 2A:
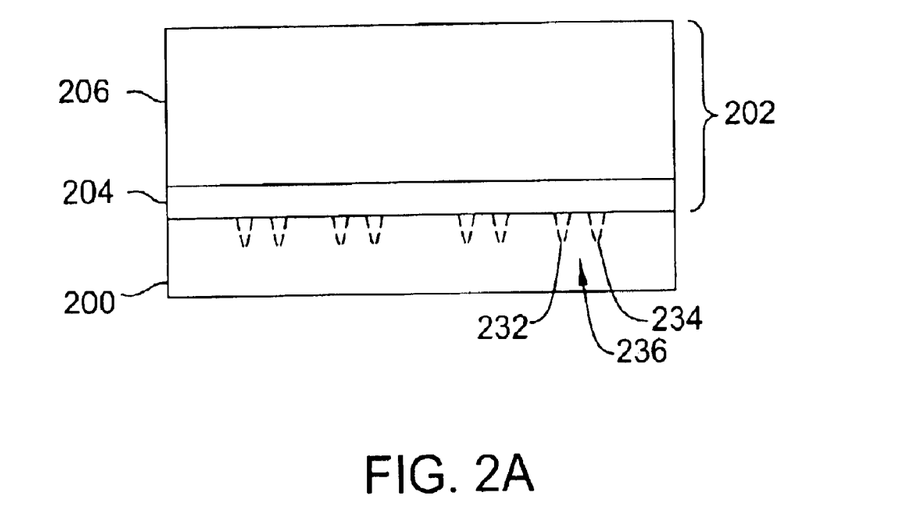
FIGS. 2A–2Q depict schematic, cross-sectional and top plan views of a substrate having a gate structure being formed in accordance with the method of FIGS. 1A–1B.
Figure 2B:
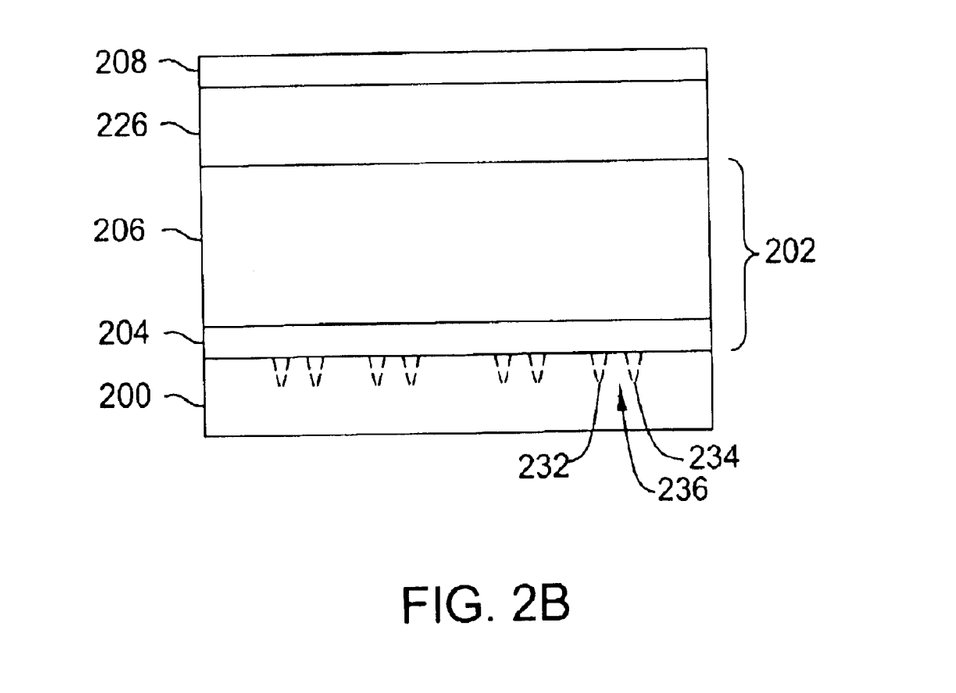
Figure 2C:
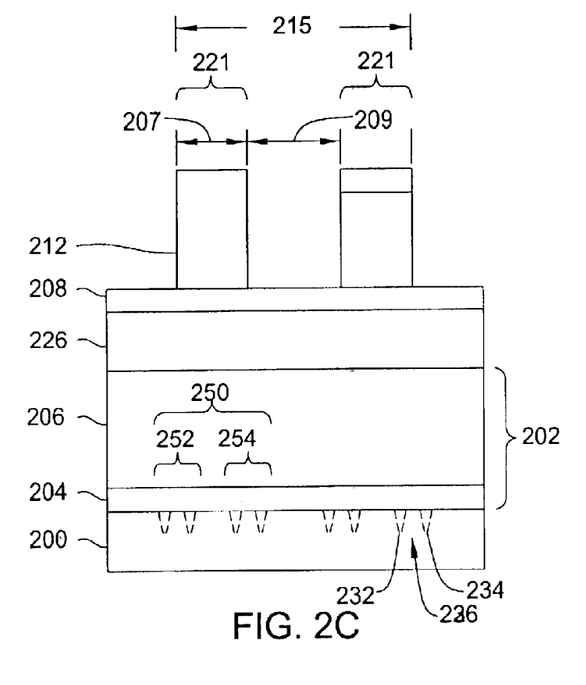
Figure 2D:
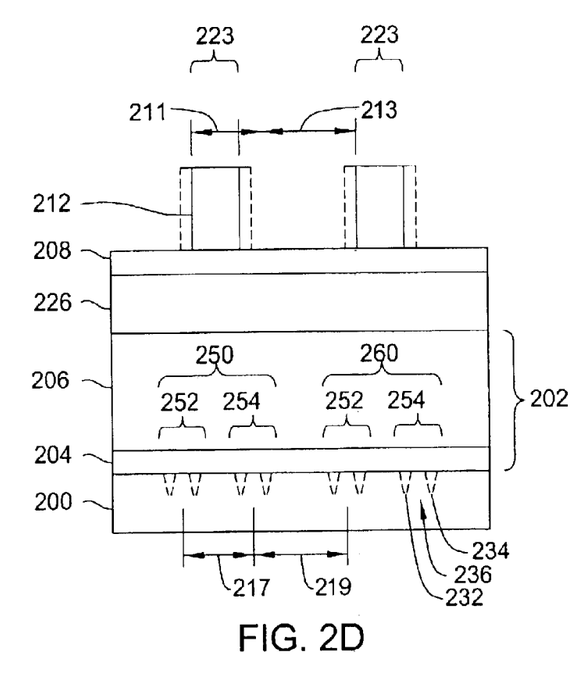
Figure 2E:
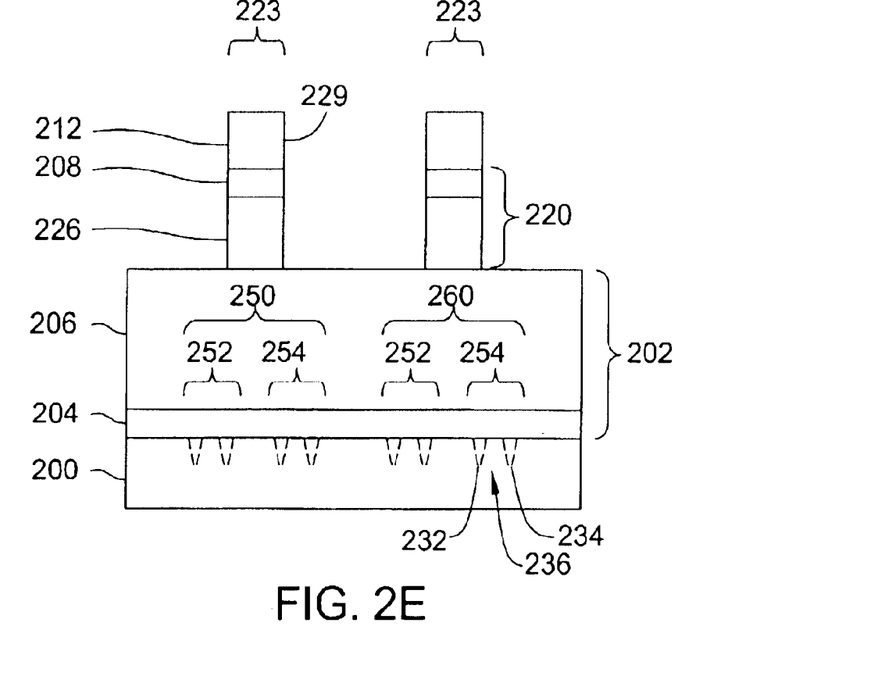
Figure 2F:
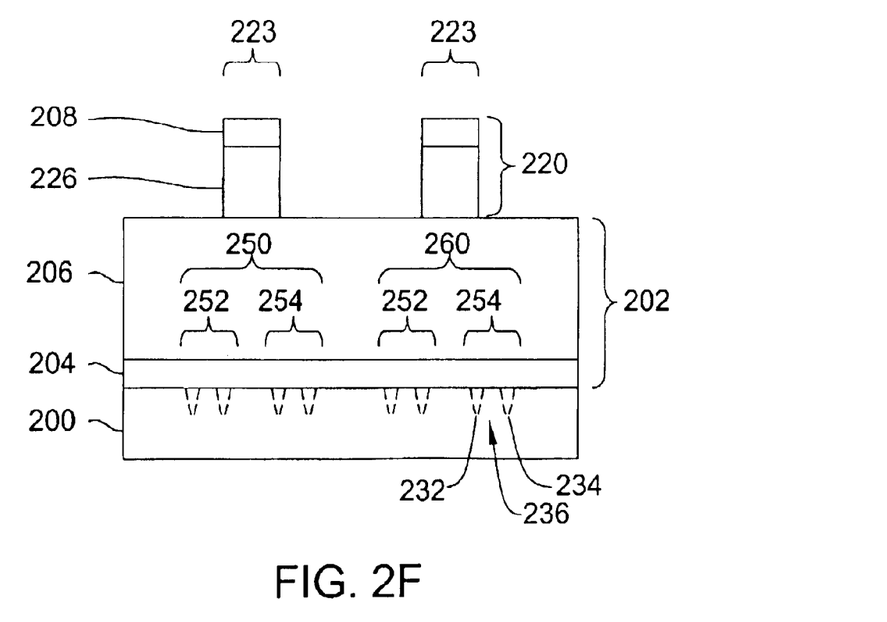
Figure 2G:
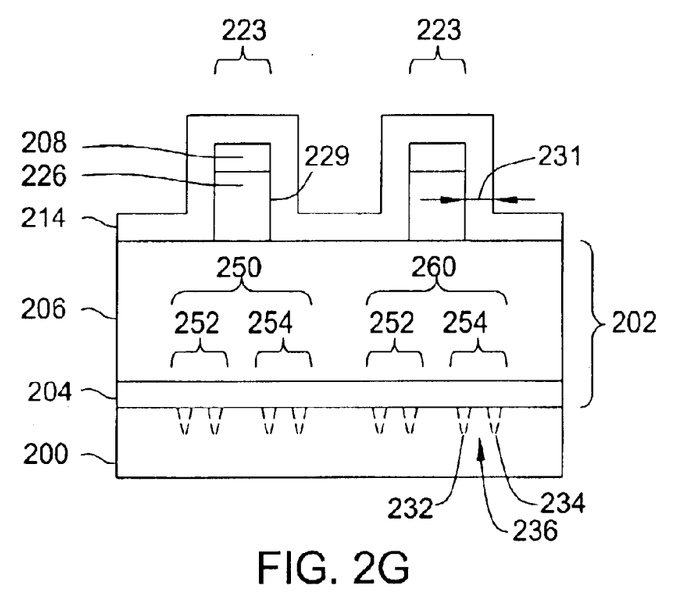
Figure 2H:
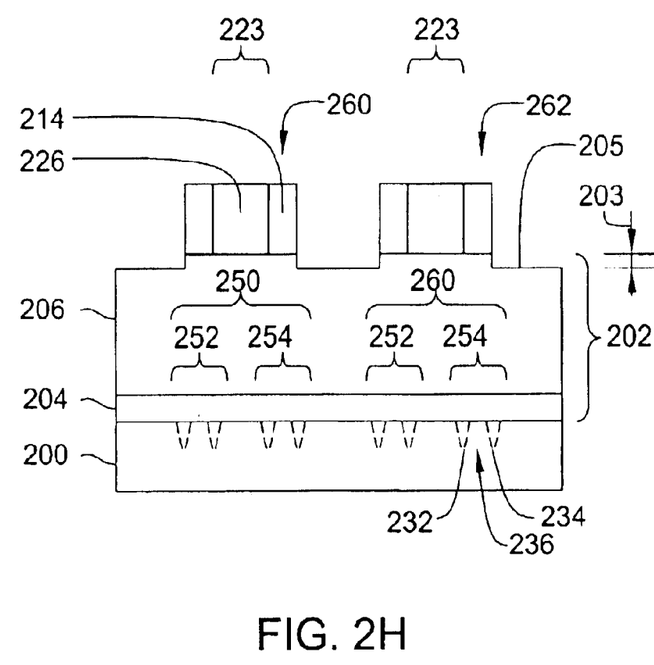
Figure 2I:
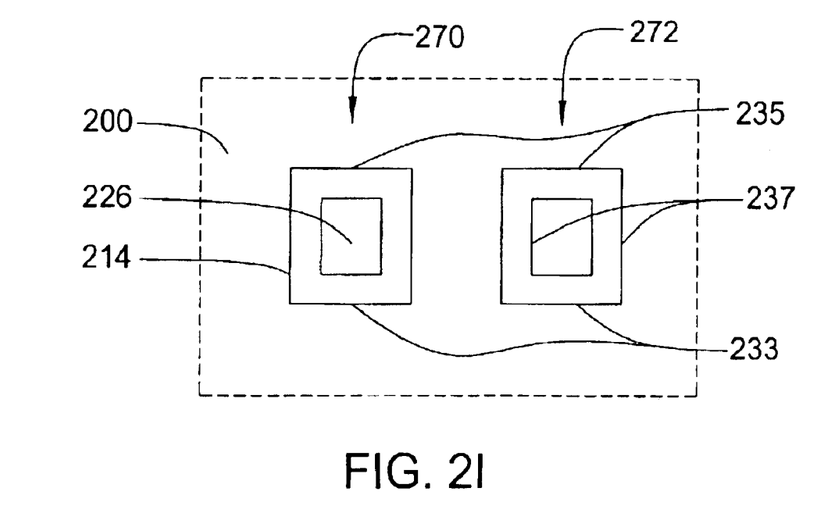
Figure 2J:
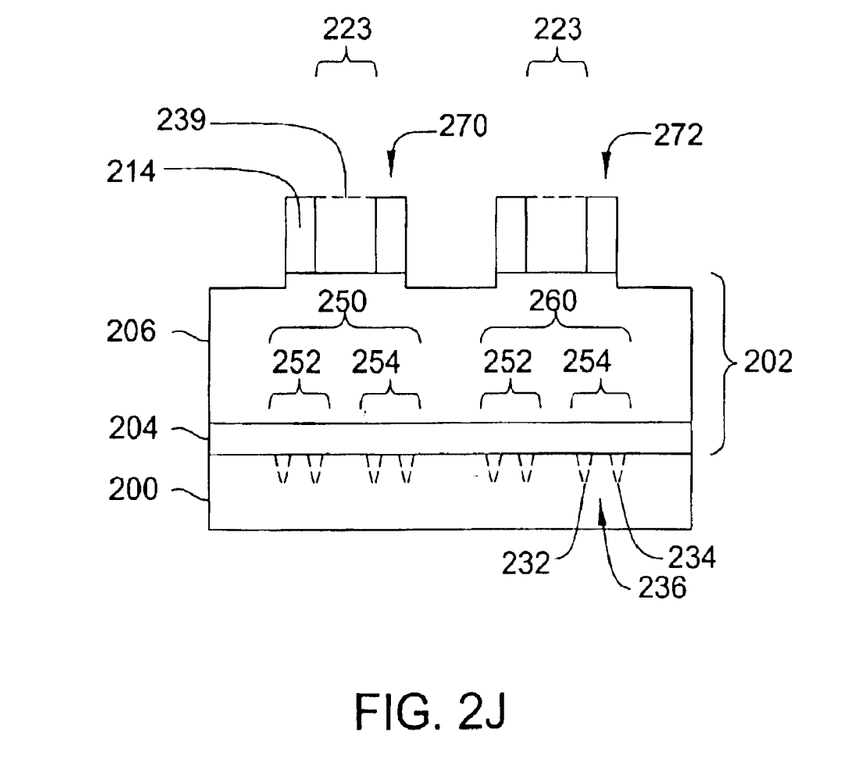
Figure 2K:
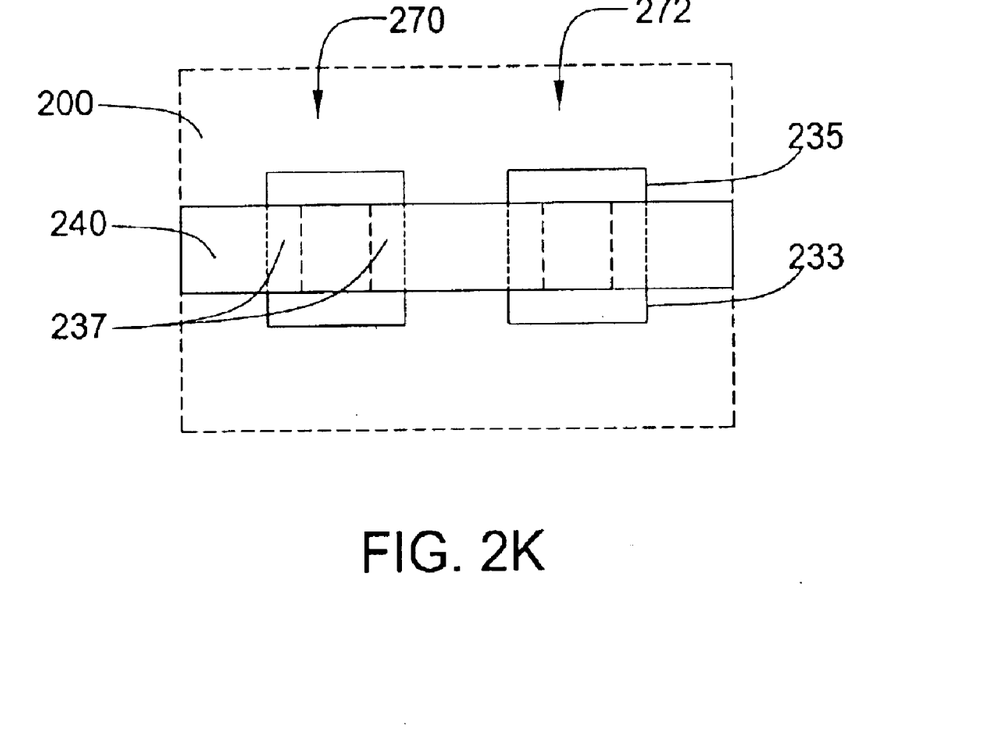
Figure 2L:
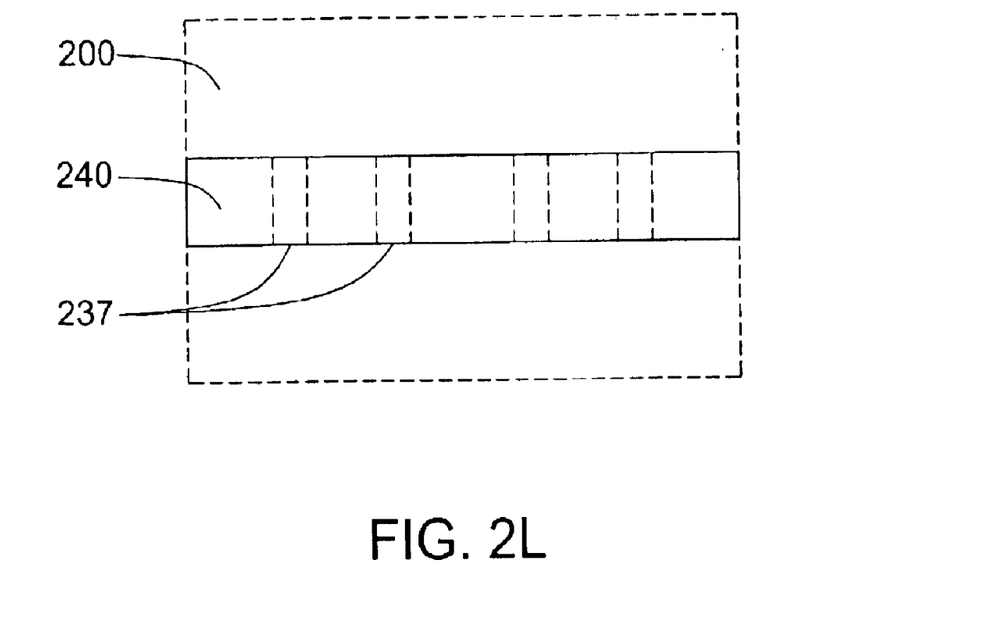
Figure 2M:
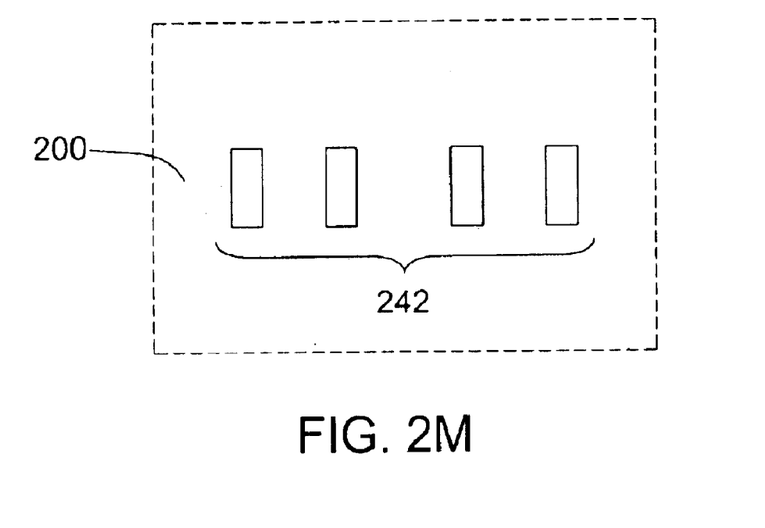
Figure 2N:
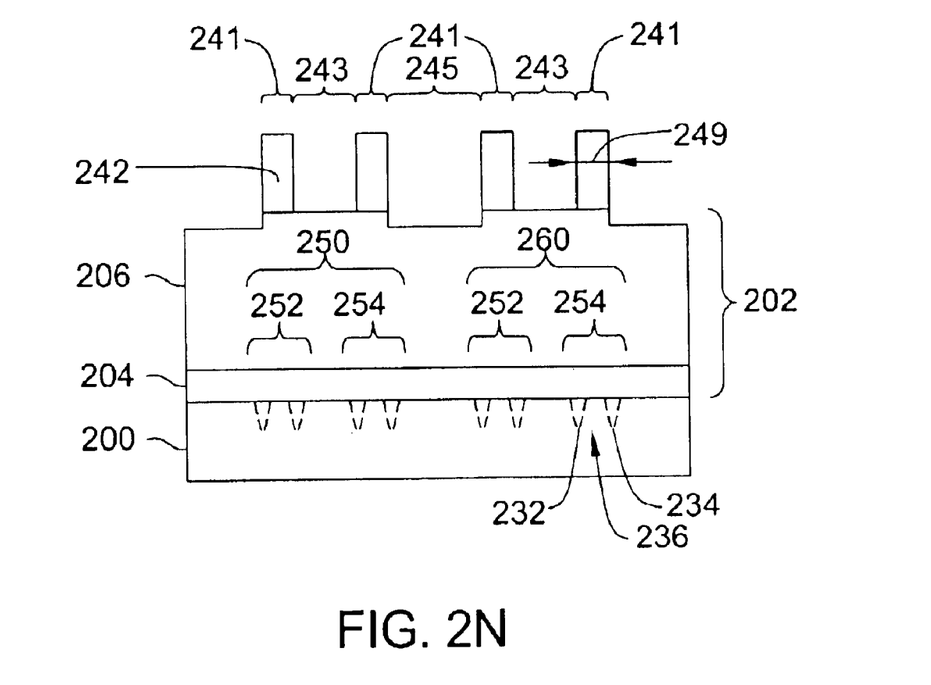
Figure 2O:
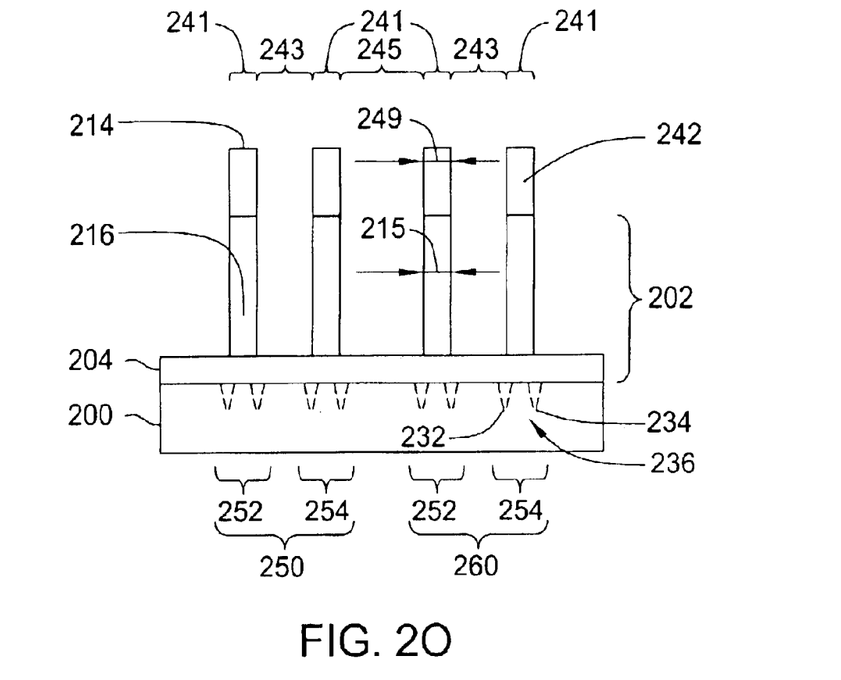
Figure 2P:
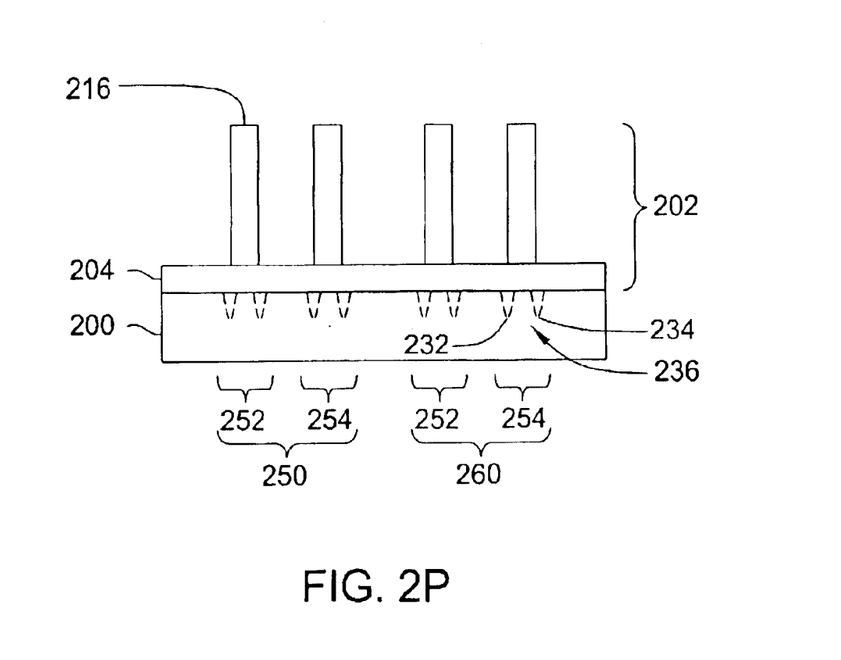
Figure 2Q:
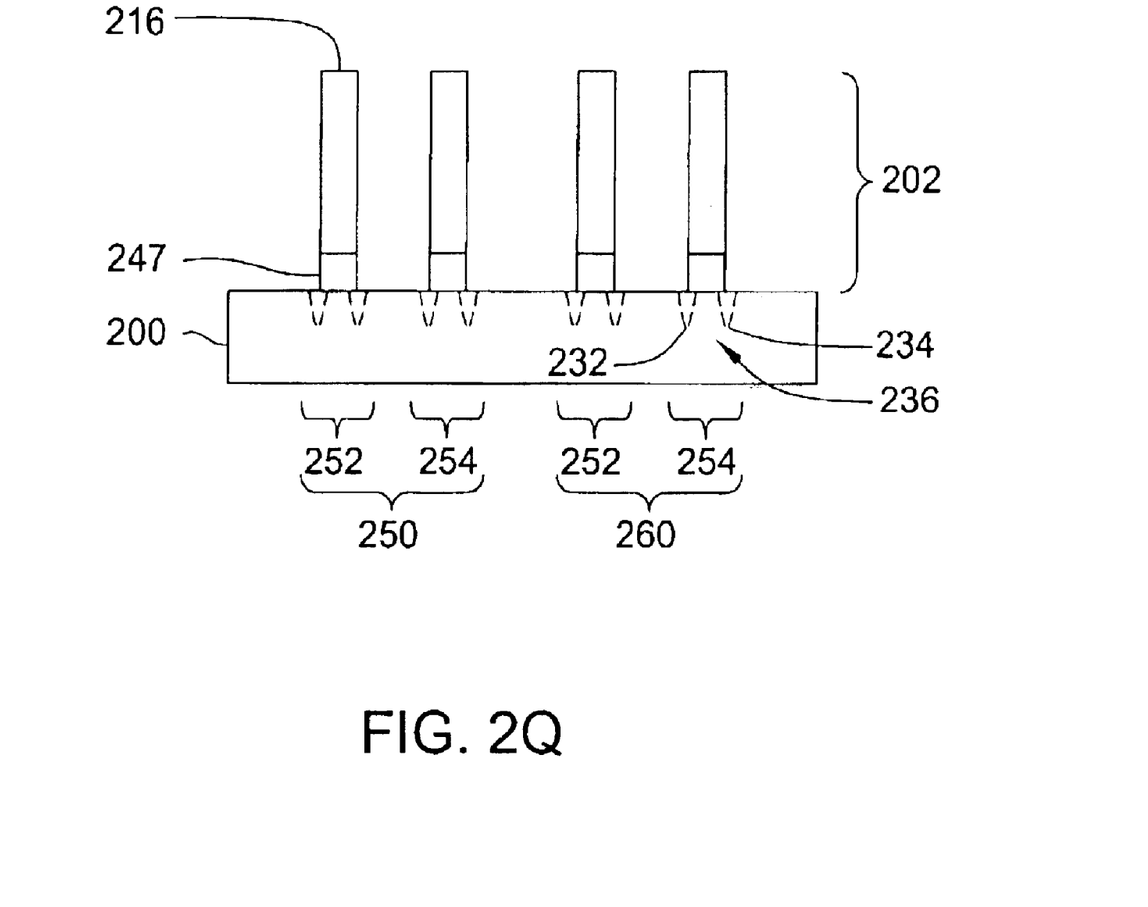

FIGS. 2A–2Q depict a sequence of schematic cross-sectional views (FIGS. 2A–2H, 2J, 2N–2Q) and top plan views (FIGS. 2I, 2K–2M) of a substrate showing a gate electrode being formed thereon using process sequence 100 of FIG. 1. To best understand the invention, the reader should simultaneously refer to FIGS. 1A–1B and 2A–2Q. The views in FIGS. 2A–2Q relate to individual processing steps that are used to form the gate electrode. Sub-processes and lithographic routines (e.g., exposure and development of photoresist, wafer cleaning procedures, and the like) are not shown in FIGS. 1A–1B and FIGS. 2A–2Q. The images in FIGS. 2A–2Q are not depicted to scale and are simplified for illustrative purposes.

Process sequence 100 begins at step 101 by forming a gate electrode stack 202 on a wafer 200 (FIG. 2A). The wafer 200, e.g., a silicon (Si) wafer, has source regions (wells) 234 and drain regions (wells) 232 that are separated by a channel region 236 wherein junctions are to be formed (shown in phantom).

The gate electrode stack 202 comprises a gate electrode layer 206 formed on a dielectric layer 204. The gate electrode layer 206 is formed, for example, of doped polysilicon (Si) to a thickness of up to about 2000 Angstroms. The dielectric layer 204 is formed, for example, of silicon dioxide ($SiO_2$) to a thickness of about 20 to 60 Angstroms. The gate dielectric layer 204 may optionally consist of one or more layers of material such as, for example, silicon dioxide ($SiO_2$), hafnium silicon dioxide ($HfSiO_2$) and aluminum oxide ($Al_2O_3$) to a thickness equivalent to that of the single silicon dioxide ($SiO_2$) layer. It should be understood, however, that the gate electrode stack 202 may comprise layers formed from other materials or layers having different thicknesses.

The layers that comprise the gate electrode stack 202 may be deposited using a vacuum deposition technique such as atomic layer deposition (ALD), physical vapor deposition (PVD), chemical vapor deposition (CVD), evaporation, and the like. Fabrication of the CMOS field effect transistors may be performed using the respective processing modules of CENTURA®, ENDURA®, and other semiconductor wafer processing systems available from Applied Materials, Inc. of Santa Clara, Calif.

At step 104, a first mask layer 226 and a dielectric anti-reflective coating (DARC) 208 are sequentially formed on the gate electrode layer 206 (FIG. 2B). In one illustrative embodiment, the first mask layer 226 comprises a layer of amorphous carbon (i.e., α-carbon) to a thickness of about 300 to about 500 Angstroms, while the dielectric anti-reflective coating (DARC) layer 208 may comprise silicon oxynitride (SiON), silicon dioxide ($SiO_2$), and the like, to a thickness of about 100 to about 300 Angstroms. The DARC layer 208 functions to minimize the reflection of the light during patterning steps. As feature sizes are reduced, inaccuracies in etch mask pattern transfer processes can arise from optical limitations that are inherent to the lithographic process, such as, for example, light reflection. Mask layer 226 and DARC layer 208 deposition techniques are described in commonly assigned U.S. patent application Ser. No. 09/590,322, filed Jun. 8, 2000 and Ser. No. 09/905,172 filed Jul. 13, 2001, which are herein incorporated by reference.

At step 106, a first patterned photoresist mask 212 is formed on the dielectric anti-reflective coating (DARC) layer 208 in region 221 (FIG. 2C). The first patterned photoresist mask 212 is formed using a conventional lithographic patterning routine, i.e., photoresist is exposed through a mask, developed, and the undeveloped portion of the photoresist is removed. The developed photoresist is generally a carbon-based polymer that remains as an etch mask on top of the DARC layer 208 in the region 221 that is intended to be protected during an etch process (FIG. 2C). The photoresist mask 212 has a line width 207 (e.g., about 100 nm) and a space 209 (e.g., about 150 nm) which together define the pitch 214 (i.e., line width plus space, 100 nm+150 nm=250 nm). The photoresist 212 is positioned on the DARC layer 208 such that the region 221 is centered above and between where the pairs 250 of adjacent transistors 252 and 254 are to be formed.

At step 108, the line width 207 of the photoresist mask 212 may optionally be reduced to a desired value 211 (e.g., about 40 to 80 nm) using a photoresist mask trimming process (FIG. 2D). The line width 207 may be trimmed to more accurately center the photoresist mask 212 above and between where the pairs 250 of adjacent transistors 252 and 254 are to be formed. The mask trimming process is a plasma process that uses an oxygen-based chemistry to perform isotropic etching of the photoresist. The trimming process decreases the line width 207 (FIG. 2C) to a desired value 211, as well as decreases the height of the photoresist mask 212. The trimmed mask 212 protects a region 223 (FIG. 2D) that is narrower than the region 221 (FIG. 2C).

The line width 211 of the trimmed mask 212 is selected to be equal to the space critical dimension (CD) for the gate pairs 250 to be fabricated. The space 213 is selected to be not greater than an interval 219 between the adjacent pairs (e.g., pairs 250 and 260) of the transistors 252, 254.

The photoresist mask trimming process is desirable when resolution of the lithographic patterning process is insufficient for transferring an accurate image of the gate structure into a photoresist mask 212.

Step 108 can be performed in an etch reactor such as a Decoupled Plasma Source (DPS) II module of the CENTURA® system available from Applied Materials, Inc. of Santa Clara, Calif. The DPS II module uses a 2 MHz inductive plasma source to produce a high-density plasma. The wafer is biased by a 13.56 MHz bias source. The decoupled nature of the plasma source allows independent control of ion energy and ion density. The DPS II module is described in more detail in reference to FIG. 3 below.

In one illustrative embodiment, the width of the mask 212 is trimmed using a plasma comprising hydrogen bromide (HBr) at a flow rate of 3 to 200 sccm, oxygen at a flow rate of 5 to 100 sccm (corresponds to a $HBr:O_2$ flow ratio ranging from 1:30 to 40:1) and argon (Ar) at a flow rate of 10 to 200 sccm. The plasma is generated using a plasma power of 200 to about 2000 W and a bias power of 0 to 300 W, a wafer pedestal temperature between 0 to 80 degrees Celsius and a chamber pressure of about 2 to 30 mTorr.

One exemplary photoresist trimming process is performed uses HBr at a flow rate of 80 sccm, $O_2$ at a flow rate of 28 sccm (i.e., a $HBr:O_2$ flow ratio of about 2.5:1), Ar at a flow rate of 20 sccm, a plasma power of 500 W, a bias power of 0 W, and a wafer pedestal temperature of 65 degrees Celsius at a chamber pressure of 4 mTorr.

At step 110, the pattern of the etch mask is transferred through the DARC layer 208 and the amorphous carbon masking layer 226 (FIG. 2E) to form a first mask 220. During step 110 the DARC layer 208 is etched using a fluorocarbon gas (e.g., carbon tetrafluoride ($CF_4$), sulfur hexafluoride ($SF_6$), trifluoromethane ($CHF_3$), difluoromethane ($CH_2F_2$), and the like). Thereafter, the amorphous carbon masking layer 226 is etched using an etch process that includes a gas (or gas mixture) comprising hydrogen bromide (HBr), oxygen ($O_2$), and at least one inert gas, such as, for example, argon (Ar), helium (He), neon (Ne), and the like. Herein the terms "gas" and "gas mixture" are used interchangeably. In one embodiment, step 110 uses the photoresist mask 212 as an etch mask and the gate electrode layer 206 as an etch stop layer. Alternatively, an endpoint detection system of the etch reactor may monitor plasma emissions at a particular wavelength to determine an end of the etch process. Further, both etch processes of step 110 may be performed in-situ (i.e., in the same etch reactor).

In one illustrative embodiment, the DARC layer 208 comprising silicon oxynitride (SiON) is etched using carbon tetrafluoride ($CF_4$) at a flow rate of 40 to 200 sccm, argon (Ar) at a flow rate of 40 to 200 sccm (i.e., a $CF_4$:Ar flow ratio of 1:5 to 5:1), plasma power of 250 W to 750 W, bias power of 0 to 300 W, and maintaining the wafer pedestal at a temperature between 40 and 85 degrees Celsius at a chamber pressure of 2 to 10 mTorr. The DARC layer 208 etch process is terminated by observing the magnitude of the plasma emission spectrum at 3865 Angstroms, which will drop significantly after the underlying amorphous carbon masking layer 226 is reached, and subsequently conducting a 40% over etch (i.e., continuing the etch process for 40% of the time that led up to the observed change in the magnitude of the emission spectra).

One exemplary silicon oxynitride (SiON) DARC layer 208 etch process is performed using carbon tetrafluoride ($CF_4$) at a flow rate of 120 sccm, argon (Ar) at a flow rate of 120 sccm (i.e., a $CF_4$:Ar flow ratio of about 1:1), a plasma power of 360 W, a bias power of 60 W, a wafer pedestal temperature of about 65 degrees Celsius and a chamber pressure of 4 mTorr.

In one illustrative embodiment, the amorphous carbon masking layer 226 is etched using hydrogen bromide (HBr) at a flow rate of 20 to 100 sccm, oxygen ($O_2$) at a flow rate of 5 to 60 sccm (i.e., a HBr:$O_2$ flow ratio of 1:3 to 20:1) argon (Ar) at a flow rate of 20 to 100 sccm, plasma power of 500 W to 1500 W, bias power of 0 to 300 W, and maintaining the wafer pedestal at a temperature between 40 and 85 degrees Celsius at a chamber pressure of 2 to 10 mtorr. The amorphous carbon masking layer 226 etch process is terminated by observing the magnitude of the plasma emission spectrum at 4835 Angstroms, which will drop significantly after the underlying gate electrode layer 206 is reached, and subsequently conducting a 30% over etch to remove residues (i.e., continuing the etch process for 30% of the time that led up to the observed change in the magnitude of the emission spectra).

One exemplary amorphous carbon masking layer 226 etch process is performed using hydrogen bromide (HBr) at a flow rate of 60 sccm, oxygen ($O_2$) at a flow rate of 20 sccm (i.e., a HBr:$O_2$ flow ratio of about 3:1), Ar at a flow rate of 60 sccm, a plasma power of 600 W, a bias power of 100 W, a wafer pedestal temperature of 65 degrees Celsius, and a pressure of 4 mTorr. Such process has etch directionality of at least 20:1. Herein the term "etch directionality" is used to describe a ratio of the etch rates at which the amorphous carbon layer 226 is removed on horizontal surfaces and on vertical surfaces, such as sidewalls 229. During step 110, the high etch directionality of the etch process protects the sidewalls 229 of the photoresist mask 212 and amorphous carbon masking layer 226 from lateral etching and, as such, preserves the dimensions thereof.

At step 112, the photoresist mask 212 is removed (or stripped) from the substrate (FIG. 2F). Generally, step 112 is performed using a conventional photoresist stripping process that uses an oxygen-based chemistry, e.g., a gas mixture comprising oxygen and nitrogen. Alternatively, step 112 may use the same gases used for etching the amorphous carbon masking layer 226 in step 110, as well as be performed in the same etch reactor. During step 112, as with step 110, the etching chemistry and process parameters are specifically selected to provide high etch directionality to preserve the dimensions and location of the amorphous carbon masking layer 226. In one illustrative embodiment, steps 110 and 112 are performed in-situ using, e.g., the DPS II module.

One exemplary photoresist stripping process is performed using hydrogen bromide (HBr) at a flow rate of 60 sccm, oxygen ($O_2$) at a flow rate of 20 sccm (i.e., a HBr:$O_2$ flow ratio of about 3:1), argon (Ar) at a flow rate of 60 sccm, a plasma power of 600 W, a bias power of 100 W, a wafer pedestal temperature of 65 degrees Celsius, and a chamber pressure of 4 mTorr. Such stripping process has etch directionality of at least 10:1, as well as etch selectivity to the DARC film 208 (e.g., silicon oxynitride (SiON)) over photoresist (mask 212) of at least 1:20.

At step 114, a second mask 214 is conformably deposited onto the wafer 200 (FIG. 2G) using a conventional deposition technique, such as atomic layer deposition (ALD), physical vapor deposition (PVD), chemical vapor deposition (CVD) plasma enhanced CVD (PECVD), and the like. The second mask 214 is deposited to a sidewall thickness 231 sufficient to define the gate electrode width. The second mask 214 is generally formed silicon nitride ($Si_3N_4$), silicon dioxide ($SiO_2$), and the like.

At step 116, the second mask 214 and the DARC layer 208 is etched and removed from the horizontal surfaces (i.e., surface of the polysilicon layer 206 and the amorphous carbon layer 226, respectively) (FIG. 2H). During step 116, the polysilicon layer 206 is also etched a depth 203 (overetch).

In one embodiment, the second mask 214 (e.g., silicon nitride ($Si_3N_4$)) is etched from the horizontal surfaces using a gas mixture comprising carbon tetrafluoride ($CF_4$) and an inert gas, such as argon (Ar), helium (He), neon (Ne), and the like. Such etch process can be performed using the DPS II module by providing carbon tetrafluoride ($CF_4$) at a flow rate of 40 to 200 sccm, argon (Ar) at a flow rate of 40 to 200 sccm, plasma power of 250 W to 750 W, bias power of 0 to 300 W, and maintaining the wafer pedestal at a temperature between 40 and 85 degrees Celsius at a chamber pressure of 2 to 10 mTorr. The second mask 214 etch process is terminated by observing the magnitude of the plasma emission spectrum at 2880 Angstroms, which will increase significantly after the underlying polysilicon layer 206 is reached, and subsequently conducting up to 200% over etch (i.e., continuing the etch process for up to 200% of the time that led up to the observed change in the magnitude of the emission spectra) to ensure removal of the DARC layer 208.

One exemplary second mask 214 etch process is performed using carbon tetrafluoride ($CF_4$) at a flow rate of 120 sccm, argon (Ar) at a flow rate of 120 sccm, a plasma power of 360 W, a bias power of 60 W, a wafer pedestal temperature of about 65 degrees Celsius and a chamber pressure of 4 mTorr.

As shown in the top plan view of FIG. 2I, step 116 forms adjacent raised structures 270 and 272. Each such structure 270, 272 having a front wall 233, a back wall 235, and sidewalls 237 that are all composed of the vertical portions of the second mask layer 214. After step 116, the masking layer 226 remains only inside structures 270, 272.

At step 118, masking layer 226 comprising amorphous carbon is removed from the structures 270, 272 (FIG. 2J). The front and back walls 233, 235 of the structures 270 and 272 are illustratively shown in FIG. 2J using broken lines 239. In one embodiment, step 118 may use the stripping process described above with reference to step 112.

At step 120, a second patterned photoresist mask 240 is formed on the wafer 200 (FIG. 2K). The mask 240 protects portions of sidewalls 237 (shown in phantom) of the structures 270 and 272 while exposing the front walls 233 and back walls 235 of the structures. The mask 240 may be formed using a lithographic patterning process, such as described above in reference to step 106.

At step 122, structures 270, 272 are etched and the unprotected portions (i.e., front walls 233 and back walls 235) of the structures are removed (FIG. 2L). In one illustrative embodiment, step 124 is performed using the etch process described above with reference to step 116. Step 122 uses the mask 240 as an etch mask and may use the electrode layer 206 as an etch stop layer. Alternatively, unwanted portions of the sidewalls 233 and 235 may be removed after the polysilicon gate electrode is formed as described below.

At step 124, the mask 240 is stripped (FIGS. 2M and 2N) from the substrate leaving a plurality of second masks 242 formed on the gate electrode layer 206 (e.g., polysilicon layer) above the channel regions where the transistor junctions are to be formed. The width of each second mask 242 corresponds to the width of the gate to be defined in the gate electrode layer 206.

The second masks 242 protect the regions 241 of the gate electrode layer 206 and exposes the regions 243 and 245 of the layer 206. Each region 241 is positioned above the channel region 236 and portions of the source and drain regions 232 and 234 of the transistors 252 or 254 to be fabricated. Regions 243 relate to the intervals between the gate structures of the transistors 252 and 254 of the same pair (e.g., pair 250 or 260) of the transistors. Similarly, regions 245 relate to the intervals between the adjacent pairs of the transistors.

At step 126, the gate electrode layer 206 is etched and removed in the regions 243 and 245 (FIG. 2O). As such, step 126 forms a plurality of gate electrodes 216. A gate electrode 216 (e.g., polysilicon gate electrode) has a width 215 that is defined by the width 249 of the second mask 242 and positioned in one of the regions 241. As such, the width 215 of the gate electrode 216 is defined by the sidewall thickness 231 of the second mask layer 214 that is about 10 to 50 nm. Step 126 uses the second mask 242 as an etch mask and the gate dielectric layer 204 as an etch stop layer.

In one embodiment, step 126 is performed using the DPS II reactor by providing a gas mixture comprising carbon tetrafluoride, hydrogen bromide (HBr), chlorine (Cl$_2$), and a dilution of oxygen in helium (He—O$_2$) is used to etch polysilicon gate electrode layer 206. Generally, step 126 uses carbon tetrafluoride at a rate of 15 to 45 sccm and hydrogen bromide at a rate of 15 to 150 (i.e., a CF$_4$:HBr flow ratio ranging from 1:10 to 3:1), as well as chlorine at a rate of 30 to 90 sccm and a mixture of 70% He and 30% O$_2$ at a rate of 6 to 18 sccm. Further, step 126 applies plasma power of 300 to 1500 W and bias power of 40 to 120 W, and maintains a wafer pedestal temperature at 20 to 80 degrees Celsius and a pressure in a process chamber at 2 to 6 mTorr. One exemplary process provides CF$_4$ at a rate of 35 sccm and HBr at a rate of 125 sccm (i.e., a CF$_4$:HBr flow ratio of about 1:4), Cl$_2$ at a rate of 60 sccm, a mixture of 70% He and 30% O$_2$ at a rate of 8 sccm, plasma power of 600 W, bias power of 80 W, a wafer pedestal temperature of 65 degrees Celsius, and a pressure of 4 mTorr.

At step 128, the second mask 242 is removed from the gate electrode 216 (FIG. 2P). In one embodiment, step 128 uses a conventional hot phosphoric acid (H$_3$PO$_4$) etch process that simultaneously removes the second mask 242, as well as by-products of the etch process of step 126 (FIG. 2P). In one embodiment, the wafer 200 is exposed to a phosphoric acid solution at a temperature of about 160° C. After the exposure, the wafer 200 is rinsed in distilled water to remove any remaining traces of the phosphoric acid etchant. Such phosphoric acid etchant process can be performed using, e.g., an automated wet cleaning module that is described in commonly assigned U.S. patent application Ser. No. 09/945,454, filed Aug. 31, 2001, which is herein incorporated by reference. Such wet cleaning module is available from Applied Materials, Inc. of Santa Clara, Calif.

At step 130, a gate dielectric 247 is etched beneath the gate electrode 216 (FIG. 2Q). To etch the gate dielectric layer 204, step 130 may use, e.g., an etch process disclosed in commonly assigned U.S. patent application Ser. No. 10/194,566, filed Jul. 12, 2002 which is herein incorporated by reference, or other conventional etch process that is suitable for etching the material of the gate dielectric layer 204 with high etch selectivity to the material of the gate electrode 216 and the substrate 200.

At step 132, the method 100 ends.

Figure 3:
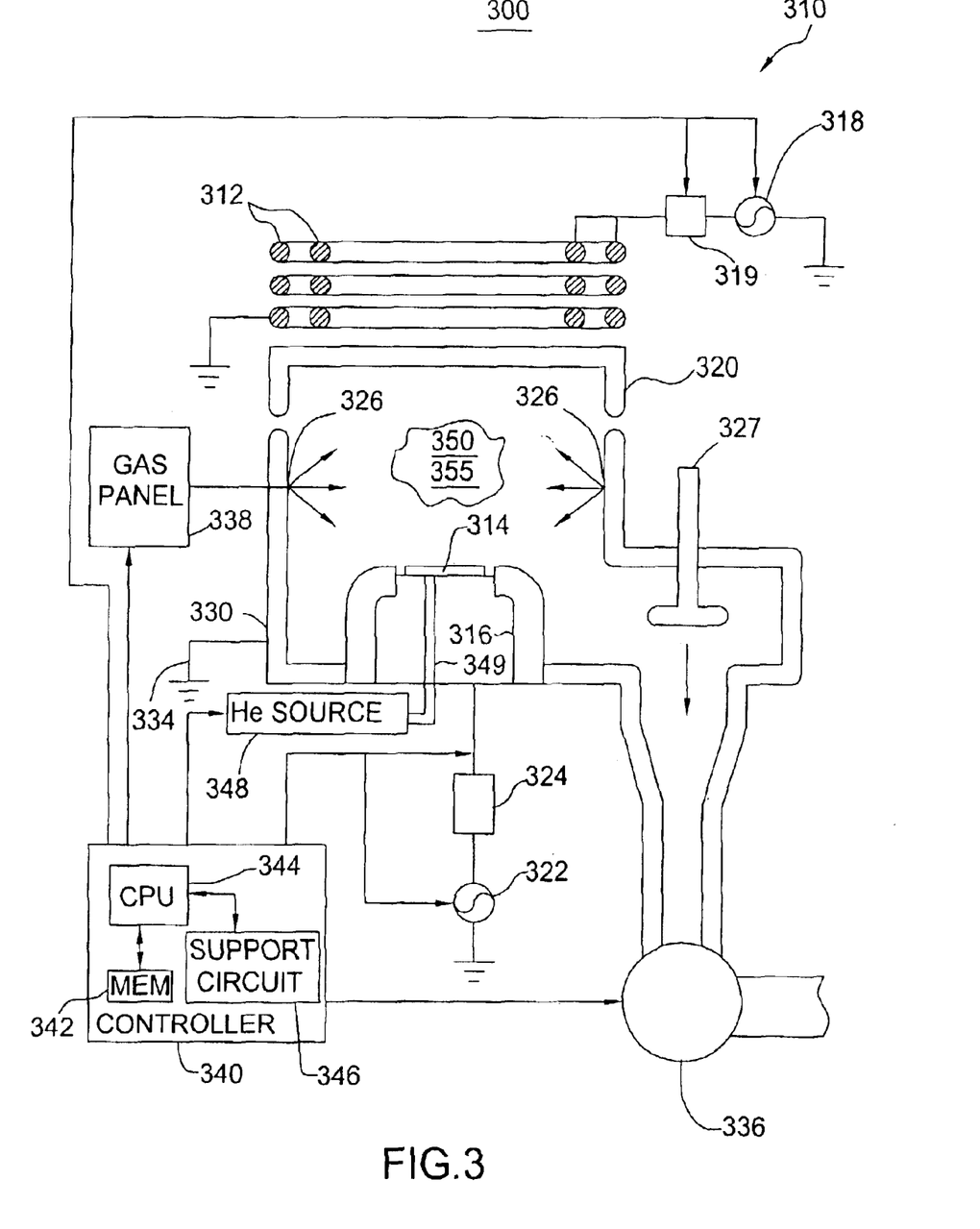
FIG. 3 depicts a schematic diagram of an exemplary plasma processing apparatus of the kind used in performing portions of the inventive method.

One illustrative embodiment of an etch reactor that can be used to perform the etching step(s) of the present invention is depicted in FIG. 3.

FIG. 3 depicts a schematic diagram of the DPS II etch reactor 300 that may be used to practice the inventive method. The process chamber 310 comprises at least one inductive coil antenna segment 312, positioned exterior to a dielectric ceiling 320. Other modifications may have other types of ceilings, e.g., a dome-shaped ceiling. The antenna segment 312 is coupled to a radio-frequency (RF) source 318 that is generally capable of producing an RF signal having a tunable frequency of about 50 kHz and 13.56 MHz. The RF source 318 is coupled to the antenna 312 through a matching network 319. Process chamber 310 also includes a wafer support pedestal (cathode) 316 that is coupled to a source 322 that is generally capable of producing an RF signal having a frequency of approximately 13.56 MHz. The source 322 is coupled to the cathode 316 through a matching network 324. Optionally, the source 322 may be a DC or pulsed DC source. The chamber 310 also contains a conductive chamber wall 330 that is connected to an electrical ground 334. A controller 340 comprising a central processing unit (CPU) 344, a memory 342, and support circuits 346 for the CPU 344 is coupled to the various components of the DPS etch process chamber 310 to facilitate control of the etch process.

In operation, the semiconductor wafer 314 is placed on the wafer support pedestal 316 and gaseous components are supplied from a gas panel 338 to the process chamber 310 through entry ports 326 to form a gaseous mixture 350. The gaseous mixture 350 is ignited into a plasma 355 in the process chamber 310 by applying RF power from the RF sources 318 and 322 respectively to the antenna 312 and the cathode 316. The pressure within the interior of the etch chamber 310 is controlled using a throttle valve 327 situated between the chamber 310 and a vacuum pump 336. The temperature at the surface of the chamber walls 330 is controlled using liquid-containing conduits (not shown) that are located in the walls 330 of the chamber 310.

The temperature of the wafer 314 is controlled by stabilizing the temperature of the support pedestal 316 by flowing helium gas from source 348 to channels formed by the back of the wafer 314 and grooves (not shown) on the pedestal surface. The helium gas is used to facilitate heat transfer between the pedestal 316 and the wafer 314. During the processing, the wafer 314 is heated by a resistive heater within the pedestal to a steady state temperature and the helium facilitates uniform heating of the wafer 314. Using thermal control of both the ceiling 320 and the pedestal 316, the wafer 314 is maintained at a temperature of between 0 and 500 degrees Celsius. The RF power applied to the inductive coil antenna 312 has a frequency between 50 kHz and 13.56 MHz and has a power of 200 to 3000 Watts. The bias power of between 0 and 300 Watts is applied to the pedestal 316 may be in a form of a DC, pulsed DC, or RF power.

To facilitate control of the chamber as described above, the CPU 344 may be one of any form of general purpose computer processor that can be used in an industrial setting for controlling various chambers and sub-processors. The memory 342 is coupled to the CPU 344. The memory 342, or computer-readable medium, may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as software routine. The software routine may also be stored and/or executed by a second CPU (not shown) that is remotely located from the hardware being controlled by the CPU 344.

The invention may be practiced using other semiconductor wafer processing systems wherein the processing parameters may be adjusted to achieve acceptable characteristics by those skilled in the arts by utilizing the teachings disclosed herein without departing from the spirit of the invention.

Although the forgoing discussion referred to fabrication of the field effect transistor, fabrication of the other devices and structures used in the integrated circuits can benefit from the invention.

While foregoing is directed to the illustrative embodiment of the present invention, other and further embodiments of the invention may be devised without departing from the basic scope thereof, and the scope thereof is determined by the claims that follow.

What is claimed is:

1. A method of defining a feature on a substrate, comprising:
   (a) providing a substrate having a material layer formed thereon;
   (b) forming a first mask comprising amorphous carbon on the material layer;
   (c) forming a second mask conformably on one or more sidewalls of the first mask to a thickness defining a smallest width of the feature;
   (d) removing the first mask using a plasma comprising at least one of hydrogen bromide (HBr) and oxygen ($O_2$); and
   (e) plasma etching the material layer using the second mask as an etch mask to define at least one feature therein.

2. The method of claim 1 wherein step (b) further comprises:
   (b1) depositing an amorphous carbon layer on the material layer;
   (b2) forming a photoresist pattern on the amorphous carbon layer;
   (b3) transferring the photoresist pattern into the amorphous carbon layer; and
   (b4) removing the photoresist pattern.

3. The method of claim 1 wherein the first mask further comprises a dielectric antireflective coating (DARC).

4. The method of claim 1 wherein step (c) further comprises:
   (c1) depositing a second mask layer conformably over the first mask;
   (c2) removing portions of the second mask layer disposed on horizontal surfaces of the first mask and the substrate using a plasma etch process having an overetch period;
   (c3) forming over the second mask layer a photoresist pattern exposing first regions of the second mask layer;
   (c4) removing the first region of the second mask layer to form the second mask; and
   (c5) removing the photoresist pattern.

5. The method of claim 1 the first mask further comprises a dielectric antireflective coating (DARC).

6. The method of claim 1 wherein the material layer comprises polysilicon.

7. A method of fabricating a gate structure of a field effect transistor comprising:
   (a) providing a substrate having a gate electrode layer formed on a gate dielectric layer;
   (b) forming a first mask comprising amorphous carbon on regions of the gate layer above source, drain, and channel regions of the transistor;
   (c) forming a second mask conformably on one or more sidewalls of the first mask to a thickness defining a length of the channel region;
   (d) removing the first mask using a plasma comprising at least one of hydrogen bromide (HBr) and oxygen ($O_2$); and
   (e) completing the gate structure by plasma etching the gate electrode layer and the gate dielectric layer using the second mask as an etch mask.

8. The method of claim 7 wherein step (b) further comprises:
   (b1) depositing an amorphous carbon layer on the material layer;
   (b2) forming a photoresist pattern on the amorphous carbon layer;
   (b3) transferring the photoresist pattern into the amorphous carbon layer; and
   (b4) removing the photoresist pattern.

9. The method of claim 7 wherein the first mask comprises a dielectric antireflective coating (DARC) formed from at least one of silicon oxynitride (SION) and silicon dioxide ($SiO_2$).

10. The method of claim 7 wherein step (c) further comprises:
    (c1) depositing a second mask layer conformably over the first mask;
    (c2) removing portions of the second mask layer disposed on horizontal surfaces of the first mask and the substrate using a plasma etch process having an overetch period;

(c3) forming over the second mask layer a photoresist pattern exposing first regions of the second mask layer;

(c4) removing the first regions of the second mask layer to form the second mask; and (c5) removing the photoresist pattern.

11. The method of claim 7 wherein the second mask comprises a material selected from the group consisting of silicon dioxide ($SiO_2$) and silicon nitride ($Si_3N_4$).

12. The method of claim 7 wherein the gate electrode layer comprises polysilicon.

13. The method of claim 7 wherein the gate electrode layer comprises one or more films of at least one of silicon dioxide ($SiO_2$), hafnium silicon dioxide ($HfSiO_2$), and aluminum oxide ($Al_2O_3$).

14. A method of fabricating a field effect transistor on a substrate comprising:

(a) providing a substrate having a gate electrode layer formed an a gate dielectric layer;

(b) forming a first mask comprising amorphous carbon on regions of the gate electrode layer above source drain, and channel regions of the transistor;

(c) forming a second mask conformably on one or more sidewalls of the first mask to a thickness defining a length of the channel region;

(d) removing the first mask using a plasma comprising at least one of hydrogen bromide (HBr) and oxygen ($O_2$); and (e) completing the gate structure by plasma etching the gate electrode layer and the gate dielectric layer using the second mask as an etch mask.

15. The method of claim 14 wherein step (b) further comprises:

(b1) depositing an amorphous carbon layer on the material layer;

(b2) forming a photoresist pattern on the amorphous carbon layer;

(b3) transferring the photoresist pattern into the amorphous carbon layer; and (b4) removing the photoresist pattern.

16. The method of claim 14 wherein the first mask further comprises a dielectric antireflective coating (DARC) formed from at least one of silicon oxynitride (SiON) and silicon dioxide ($SiO_2$).

17. The method of claim 14 wherein step (c) further comprises:

(c1) depositing a second mask layer conformably over the first mask;

(c2) removing portions of the second mask layer disposed on horizontal surfaces of the first mask and the substrate using a plasma etch process having an overetch period;

(c3) forming over the second mask layer a photoresist pattern exposing first regions of the second mask layer;

(c4) removing the first regions of the second mask layer to form the second mask; and (c5) removing the photoresist pattern.

18. The method of claim 14 wherein the second mask comprises a material selected from the group consisting of silicon dioxide ($SiO_2$) and silicon nitride ($Si_3N_4$).

19. The method of claim 14 wherein the gate electrode layer comprises polysilicon.

20. The method of claim 14, wherein the gate electrode layer comprises one or more films of at least one of silicon dioxide ($SiO_2$), hafnium silicon dioxide ($HfSiO_2$), and aluminum oxide ($Al_2O_3$).

* * * * *

UNITED STATES PATENT AND TRADEMARK OFFICE
CERTIFICATE OF CORRECTION

PATENT NO. : 6,924,191 B2
DATED : August 2, 2005
INVENTOR(S) : Wei Liu et al.

It is certified that error appears in the above-identified patent and that said Letters Patent is hereby corrected as shown below:

Column 5,
Line 42, delete "mtorr." and insert -- mTorr. --.

Column 10,
Line 23, after "first" delete "region" insert -- regions --.
Line 56, after "mask" insert -- further --.
Line 58, delete "(SION)" and insert -- (SiON) --.

Column 11,
Line 19, delete "an" and insert -- on --.
Line 21, after "source" insert -- , --.

Signed and Sealed this

Twenty-eighth Day of February, 2006

JON W. DUDAS
*Director of the United States Patent and Trademark Office*